United States Patent [19]
Spicer et al.

[11] Patent Number: 5,263,875
[45] Date of Patent: Nov. 23, 1993

[54] APPARATUS FOR ELECTRICALLY AND MECHANICALLY COUPLING TWO PORTABLE ELECTRONIC DEVICES

[75] Inventors: William J. Spicer, Jupiter; David R. Becker, Boca Raton; John K. Capp, Lighthouse Point, all of Fla.

[73] Assignee: Motorola, Inc., Schaumburg, Ill.

[21] Appl. No.: 965,301

[22] Filed: Oct. 23, 1992

[51] Int. Cl.⁵ .......................................... H01R 13/62
[52] U.S. Cl. ........................ 439/367; 439/79; 439/328
[58] Field of Search .................. 439/61, 64, 76, 79, 439/328, 345, 367, 377, 298

[56] References Cited

U.S. PATENT DOCUMENTS

| | | | |
|---|---|---|---|
| 3,546,659 | 1/1969 | Powers | 439/298 |
| 5,007,846 | 4/1991 | Ravid | 439/79 |
| 5,020,090 | 5/1991 | Morris | 379/58 |
| 5,043,721 | 8/1991 | May | 340/825.44 |
| 5,044,967 | 9/1991 | Takano | 439/79 |
| 5,052,943 | 10/1991 | Davis | 439/298 |

OTHER PUBLICATIONS

IBM Tech. Disclosure Bull., vol. 30, No. 6 p. 34, Nov. 1987.
Motorola, Inc. News Stream Data Receiver "Information on the Move" Catalog Sheet R3-5-165, 1992, U.S.A.

*Primary Examiner*—P. W. Echols
*Attorney, Agent, or Firm*—R. Louis Breeden; William E. Koch; Thomas G. Berry

[57] ABSTRACT

The present invention comprises an apparatus for electrically and mechanically coupling first and second electronic devices (304, 302), the apparatus comprising a connector (108) for coupling the first and second electronic devices (304, 302) and a cradle (100) for fixing the position of the first electronic device (304). The cradle (100) provides an opening that allows entry and movement of the second electronic device (302) towards the connector (108) while substantially aligning the second electronic device (302) with the connector (108). The cradle (100) further comprises a movable bulkhead (110) mechanically coupled to the connector (108) for substantially aligning the connector (108) with the first and second electronic devices (304, 302) during installation.

20 Claims, 8 Drawing Sheets

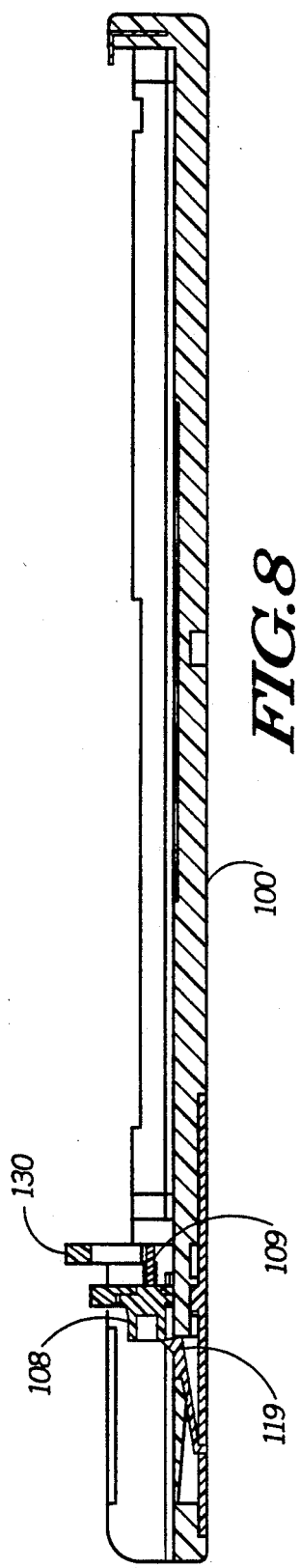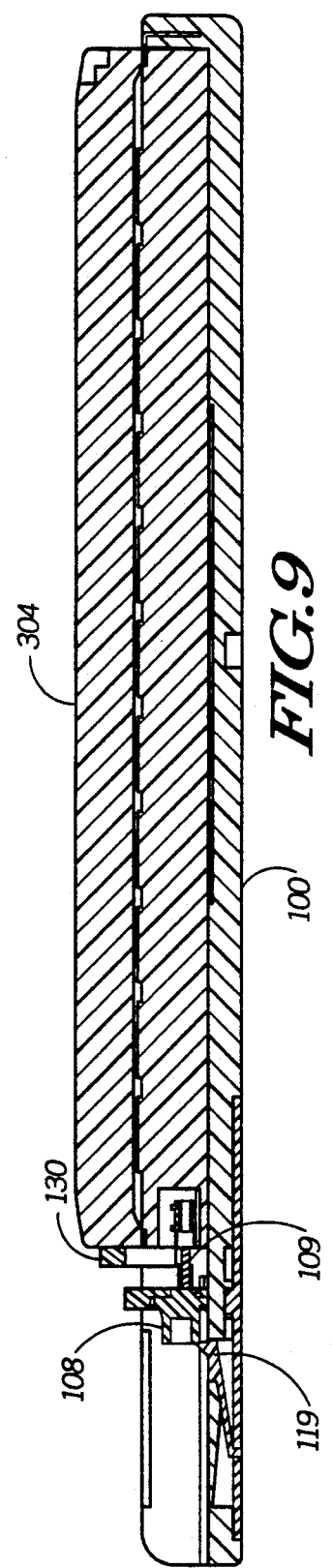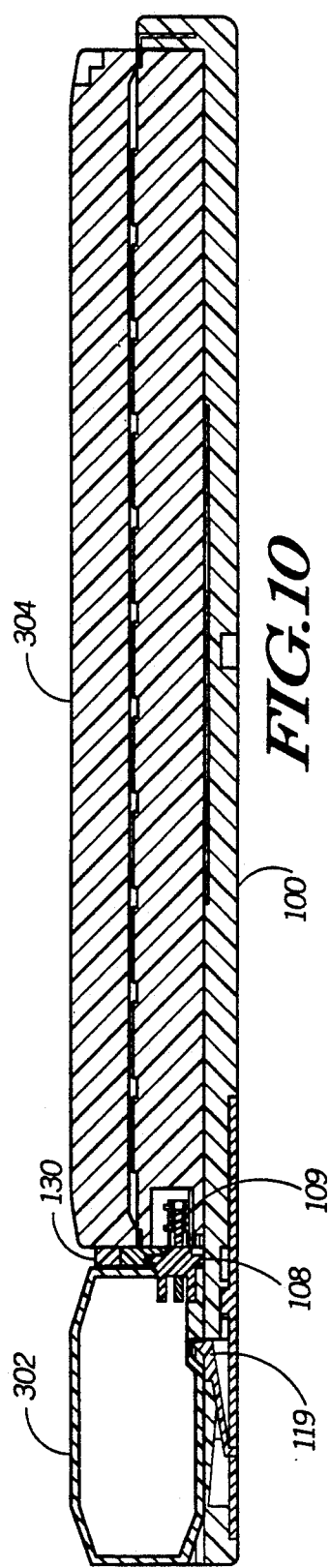

APPARATUS FOR ELECTRICALLY AND MECHANICALLY COUPLING TWO PORTABLE ELECTRONIC DEVICES

FIELD OF THE INVENTION

This invention relates in general to coupling apparatus, and more specifically to apparatus for electrically and mechanically coupling two portable electronic devices.

BACKGROUND OF THE INVENTION

Portable electronic devices having a port for interacting with other portable electronic devices have become well-known in the art. Examples of such devices have included laptop computers and electronic organizers having ports for auxiliary complementary devices, e.g., additional memory, a modem, or a selective call receiver. Typically, the two devices have been coupled to one another by a connecting cable, or by plugging the two devices directly together where compatible plug and socket arrangements have existed. Some coupling systems have used a substantially U-shaped carrier having a plurality of rails to hold the two devices tightly together.

A problem with the use of a connecting cable has been clutter and the inability of maneuvering the two portable devices as a physical whole—particularly when operated on one's lap. While the devices that plug directly together have solved the aforementioned problem to some extent, the miniature plugs and sockets often used have proved to be somewhat weak mechanically for maintaining coupling under all conditions of normal portable use. While the U-shaped carrier has obviated that problem to a fair extent, such carriers have tended to be somewhat difficult to use because of the relatively large force required for insertion and removal of the devices. Also, the U-shaped carrier does not accommodate devices having a complex geometry, e.g., a split hinge, along the rails for supporting the devices.

Thus, what is needed is a better way of mechanically and electrically coupling two portable electronic devices. A way that provides an easily maneuvered physical assembly having sufficient mechanical strength to endure all conditions of normal portable use without uncoupling is needed. An apparatus that provides a system that can be easily assembled and disassembled by a user would be highly desirable.

SUMMARY OF THE INVENTION

One aspect of the present invention is an apparatus for electrically and mechanically coupling first and second electronic devices, the apparatus comprising a connector for coupling the first and second electronic devices and a cradle having a substantially horizontal floor and substantially vertical walls for fixing the position of the first electronic device. The cradle comprises a first end formed to provide an opening that allows entry and movement of the second electronic device towards the connector while substantially aligning the second electronic device with the connector. The cradle further comprises a movable bulkhead mechanically coupled to the connector for substantially aligning the connector with the first and second electronic devices, while allowing the connector and the second electronic device when coupled to the connector to move toward the first electronic device, thus coupling the second electronic device to the first electronic device through the connector.

Another aspect of the present invention is an apparatus for electrically and mechanically coupling a selective call receiver and an electronic organizer, the apparatus comprising a connector for coupling the selective call receiver and the electronic organizer, and a cradle having a substantially horizontal floor and substantially vertical walls for fixing the position of the electronic organizer. The cradle comprises a first end formed to provide an opening that allows entry and movement of the selective call receiver towards the connector while substantially aligning the selective call receiver with the connector. The cradle further comprises a movable bulkhead mechanically coupled to the connector for substantially aligning the connector with the electronic organizer and with the selective call receiver, while allowing the connector and the selective call receiver when coupled to the connector to move toward the electronic organizer, thus coupling the selective call receiver to the electronic organizer through the connector.

BRIEF DESCRIPTION OF THE DRAWINGS

FIG. 8 is a longitudinal cross-section along the line 8—8 of FIG. 1 of the consolidation cradle in an empty condition in accordance with the preferred embodiment of the present invention.

FIG. 9 is a longitudinal cross-section along the line 8—8 of the consolidation cradle with the electronic organizer installed therein in accordance with the preferred embodiment of the present invention.

FIG. 10 is a longitudinal cross-section along the line 8—8 of the consolidation cradle with both the electronic organizer and the selective call receiver (without internal details) installed therein in accordance with the preferred embodiment of the present invention.

DESCRIPTION OF THE PREFERRED EMBODIMENT

Figure 1:
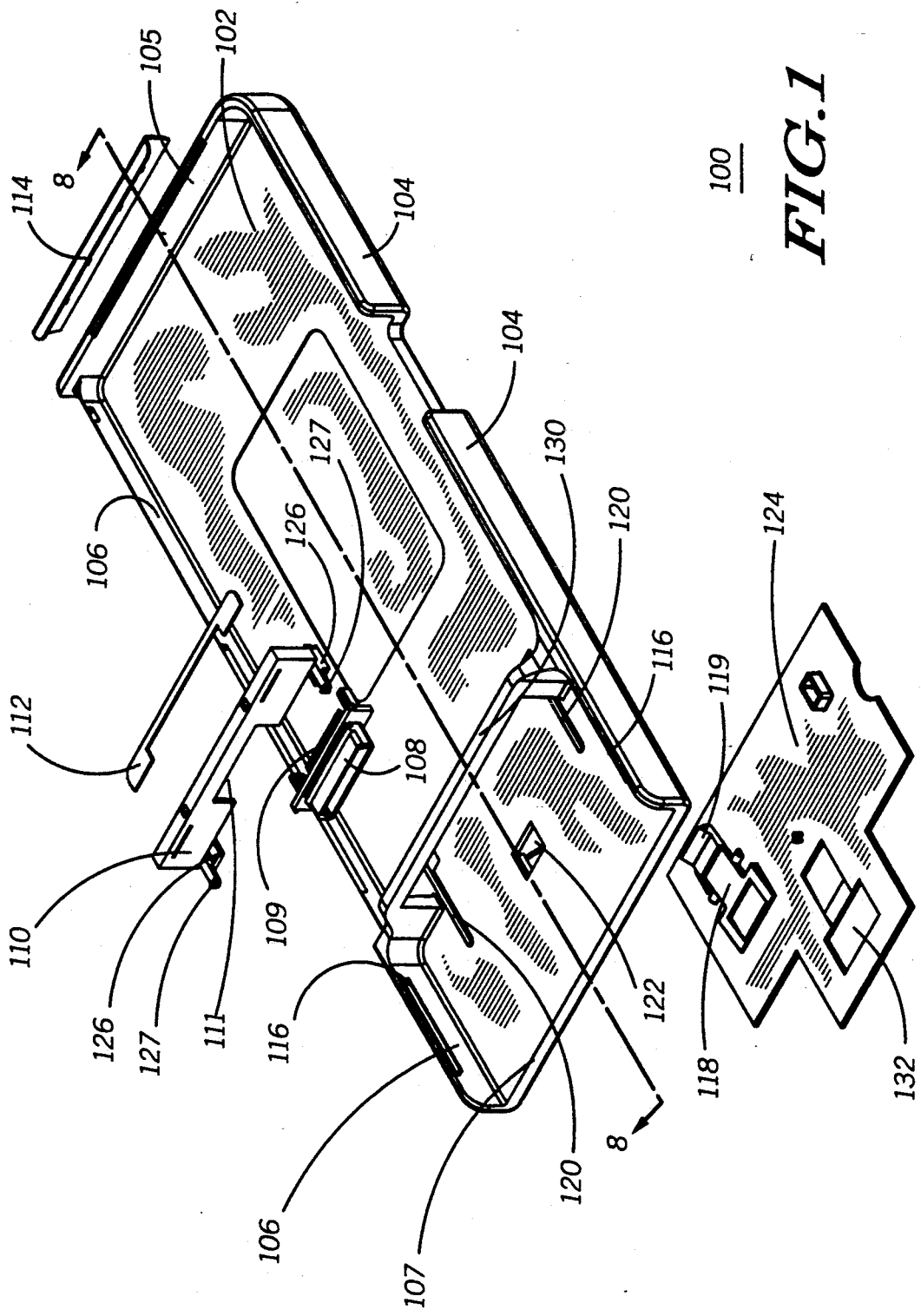
FIG. 1 is a top left front isometric assembly view of a consolidation cradle in accordance with the preferred embodiment of the present invention.

With reference to FIG. 1, a top left front isometric assembly view of a consolidation cradle 100 in accordance with the preferred embodiment of the present invention depicts a cradle floor 102, a vertical rear wall 106 formed contiguously therefrom, and a vertical front wall 104 formed contiguously therefrom. At the right end of the consolidation cradle 100 is a vertical end wall 105 formed contiguously therefrom, while the left end 107 is open. A double-sided connector 108 comprising contact pins 109 is held in place within an alignment aperture 111 of a movable bulkhead 110 after the movable bulkhead 110 is assembled into guide apertures 120 in the cradle floor 102. The alignment aperture 111 is sufficiently larger than the mounting surface of the double-sided connector 108 to absorb tolerance build-up. A bulkhead bracket 112 also is pressed into the movable bulkhead 110 during assembly. In addition, an end bracket 114 is attached to the vertical end wall 105 during assembly. The end bracket 114 and the bulkhead bracket 112 are constructed to be thin enough to prevent interference with a hinged top cover 310 (FIG. 3) of an electronic organizer 304 (FIG. 3) when the hinged top cover is closed.

Near the left end 107 and near the top of the vertical front and rear walls 104, 106 are rails 116 formed contiguously into the vertical front and rear walls 104, 106. A spring-loaded snap lever 118 comprises a snap 119 that protrudes through a snap aperture 122 after assembly, while a cover 124 is fitted to prevent the spring loaded snap lever 118 and bulkhead retaining members 126 from interfering with objects beneath the consolidation cradle 100. A small snap 127 protrudes from the upper surface of each of the two bulkhead retaining members 126. The two small snaps 127 will engage with corresponding apertures 608 (FIG. 6) when a selective call receiver 302 (FIG. 3) is fully installed in the consolidation cradle 100. The small snaps 127 insure that during removal of the selective call receiver 302 from the consolidation cradle 100 the movable bulkhead 110 will disengage fully from the electronic organizer 304, thus allowing easy removal of the electronic organizer 304. The cover 124 comprises an access aperture 132 for allowing user access to the spring-loaded snap lever 118. A bridge 130 parallel to the cradle floor 102 spans from the vertical front wall 104 to the vertical rear wall 106.

Figure 2:
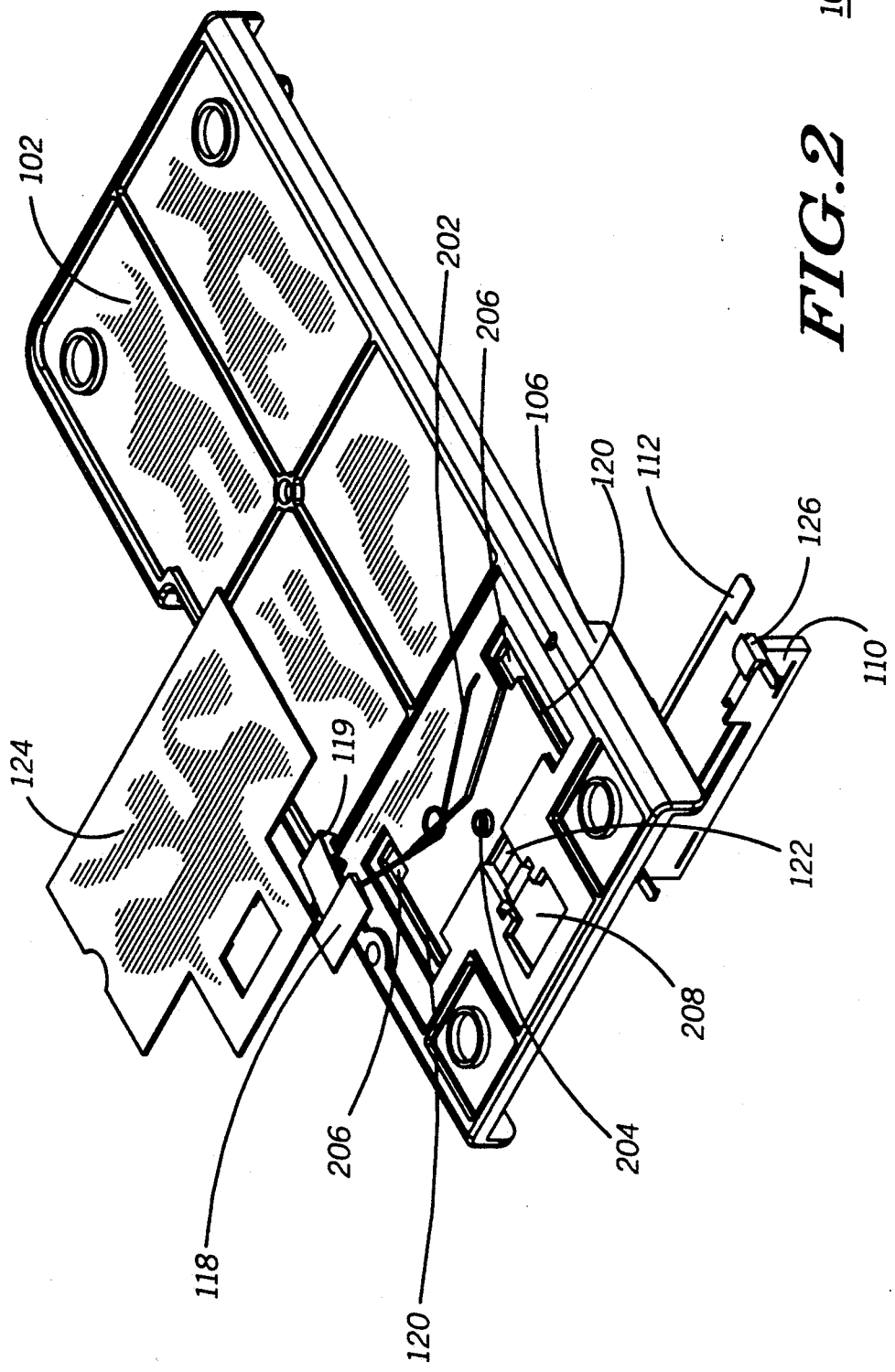
FIG. 2 is a bottom left rear isometric assembly view of the consolidation cradle in accordance with the preferred embodiment of the present invention.

With reference to FIG. 2, a bottom left rear isometric assembly view of the consolidation cradle 100 in accordance with the preferred embodiment of the present invention depicts a bulkhead spring 202 that is positioned by a spring boss 204 and applies a spring force against the bulkhead retaining members 126 after assembly. Two assembly apertures 206 allow the bulkhead retaining members 126 to pass beneath the cradle floor 102 to hold the movable bulkhead 110 movably in place within the guide apertures 120. A cavity 208 is provided to contain an elastomeric material, e.g., Poron, (not shown) that will act as a spring for the spring-loaded snap lever 118 to force the snap 119 to protrude through the snap aperture 122 and upward (in FIG. 1) somewhat into the space above the cradle floor 102.

Figure 3:
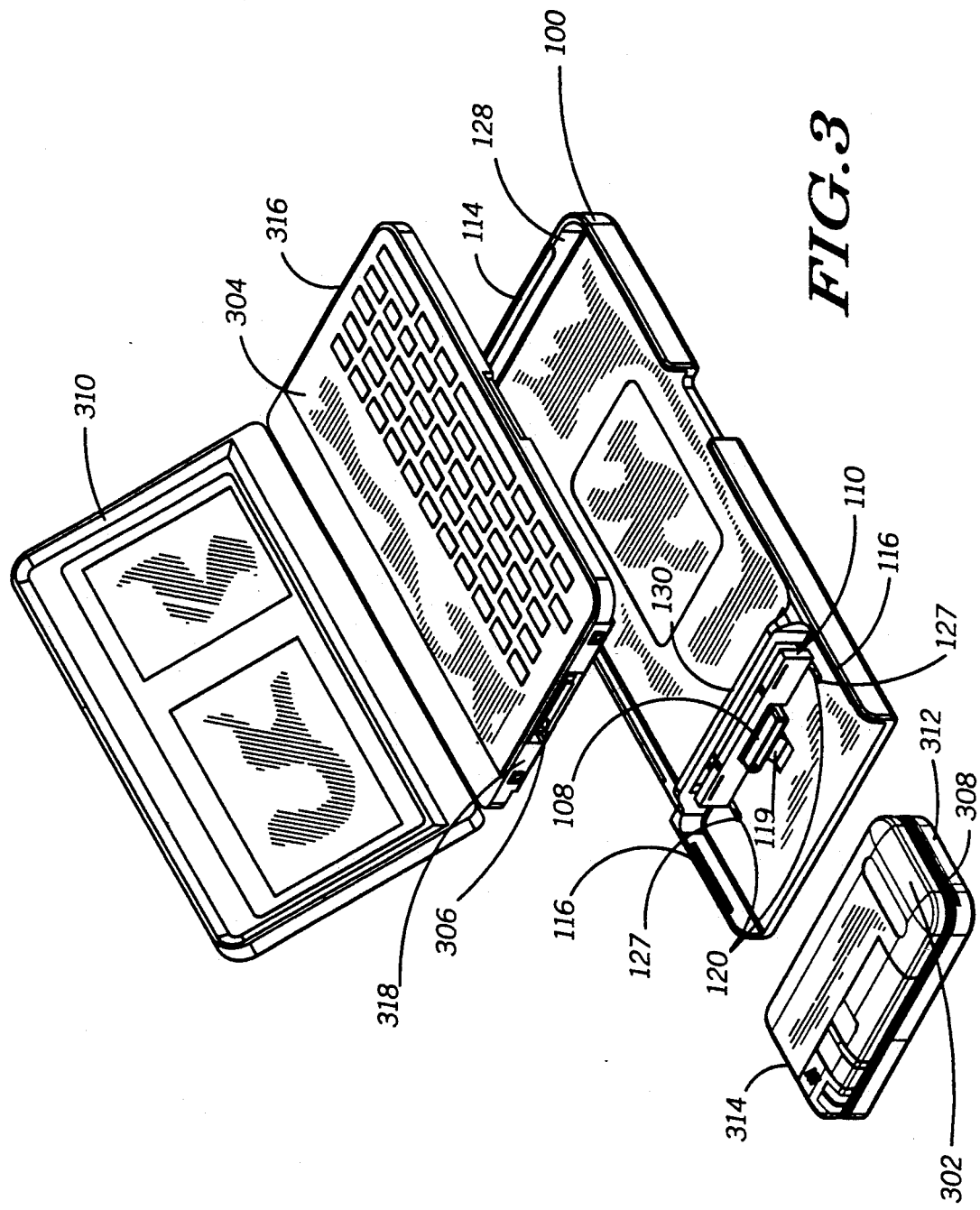
FIG. 3 is a top left front isometric view of the consolidation cradle with a selective call receiver and electronic organizer nearby and about to be installed in accordance with the preferred embodiment of the present invention.

With reference to FIG. 3, a top left front isometric view of the consolidation cradle 100 depicts the selective call receiver 302 and the electronic organizer 304 nearby and about to be installed into the consolidation cradle 100 in accordance with the preferred embodiment of the present invention. The electronic organizer 304 comprises a hinged top cover 310 and a multi pin jack 306 for mating with the double-sided connector 108. The selective call receiver 302 is constructed with grooves 308 formed in front and rear housing walls 312, 314 for mating with the rails 116.

It is of interest to note that the position of the movable bulkhead 110 is somewhat to the left of the bridge 130. In this position the bridge 130 advantageously provides protection for the contact pins 109 (FIG. 1), and the contact pins 109 will not interfere with the electronic organizer 304 as it is lowered into the consolidation cradle 100. Also of interest is the position of the snap 119 protruding through the snap aperture 122 (FIG. 1). The movable bulkhead 110 insures that the contact pins 109 (FIG. 1) can engage the multi pin jack 306 even though the geometry of the electronic organizer 304 prevents horizontal movement of the electronic organizer 304 when installed in the consolidation cradle 100.

To install the selective call receiver 302 and the electronic organizer 304 into the consolidation cradle 100, first a user places the right end 316 of the electronic organizer 304 into the consolidation cradle 100, positioning the right end 316 beneath the end bracket 114. Next, the user lowers the left end 318 of the electronic organizer 304 into the consolidation cradle 100. Next, the user mates the grooves 308 of the selective call receiver 302 with the rails 116 of the consolidation cradle 100, and slides the selective call receiver to the right to couple a data port 602 (FIG. 6) to the double sided connector 108.

Figure 4:
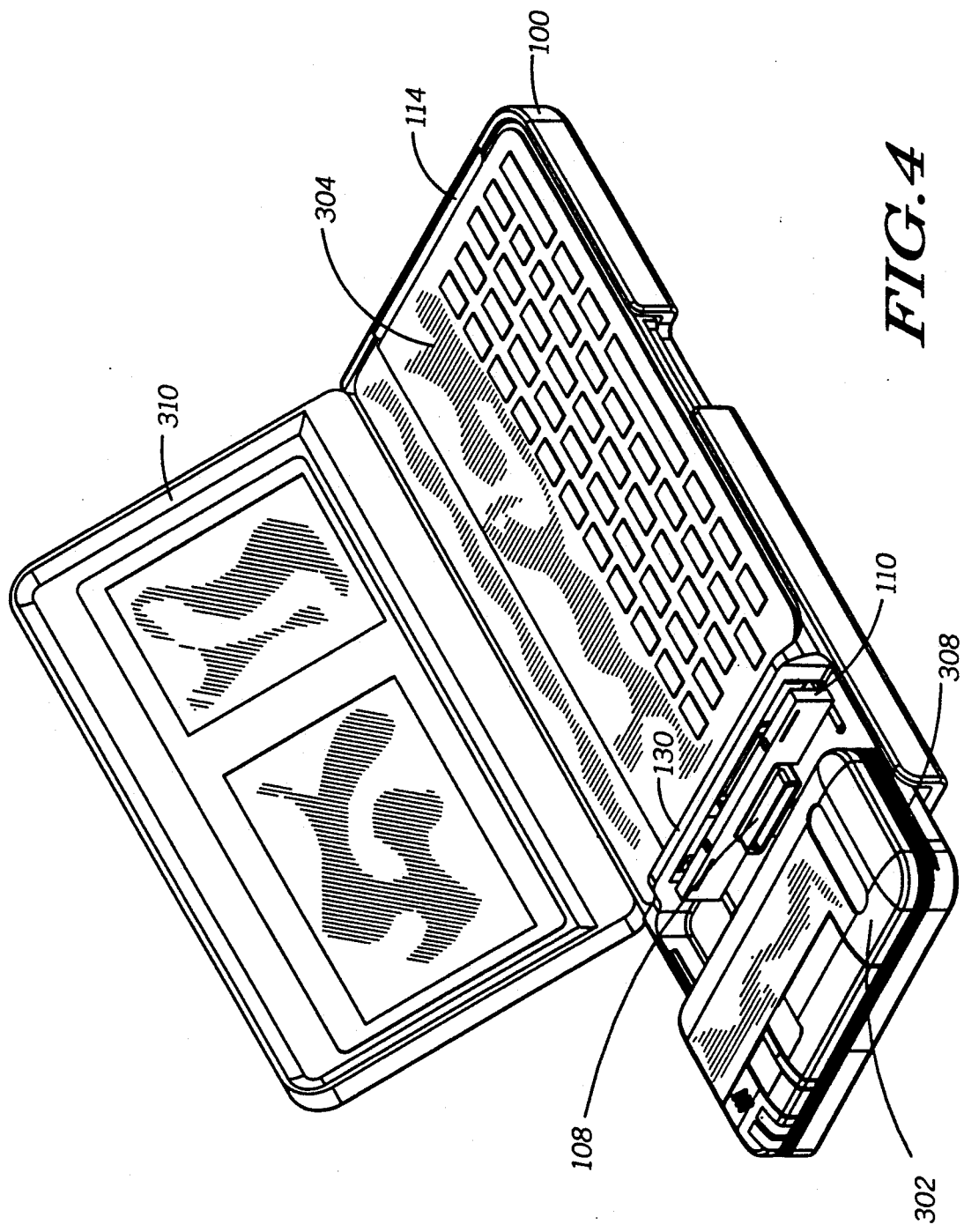
FIG. 4 is a top left front isometric view showing the electronic organizer fully in place and the selective call receiver partially in place in the consolidation cradle in accordance with the preferred embodiment of the present invention.

With reference to FIG. 4, a top left front isometric view shows the electronic organizer 304 fully in place and the selective call receiver 302 partially in place in the consolidation cradle 100 in accordance with the preferred embodiment of the present invention. When the user slides the selective call receiver 302 still further to the right, the double-sided connector 108 and movable bulkhead 110 engage fully with the selective call receiver 302 and move to the right, acting against force from the bulkhead spring 202 (FIG. 2). When the double sided connector 108 and movable bulkhead 110 have moved sufficiently to the right, the contact pins 109 (FIG. 1) of the double-sided connector 108 couple to the multi-pin jack 306 (FIG. 3), thus electrically coupling the selective call receiver 302 with the electronic organizer 304. When the selective call receiver 302 has moved sufficiently to the right for a latch aperture 604 (FIG. 6) to allow entry of the snap 119 (FIG. 3) of the spring loaded snap lever 118 (FIG. 1) into the latch aperture 604, the selective call receiver 302 is mechanically locked in place. When the selective call receiver 302 is mechanically locked in place, the movable bulkhead 110 is positioned fully to the right, thus positioning the bulkhead bracket 112 (FIG. 1) over a portion of the left end 318 (FIG. 3) of the electronic organizer 304. The bulkhead bracket 112 in this position firmly locks the electronic organizer 304 in place, completing the installation.

Figure 5:
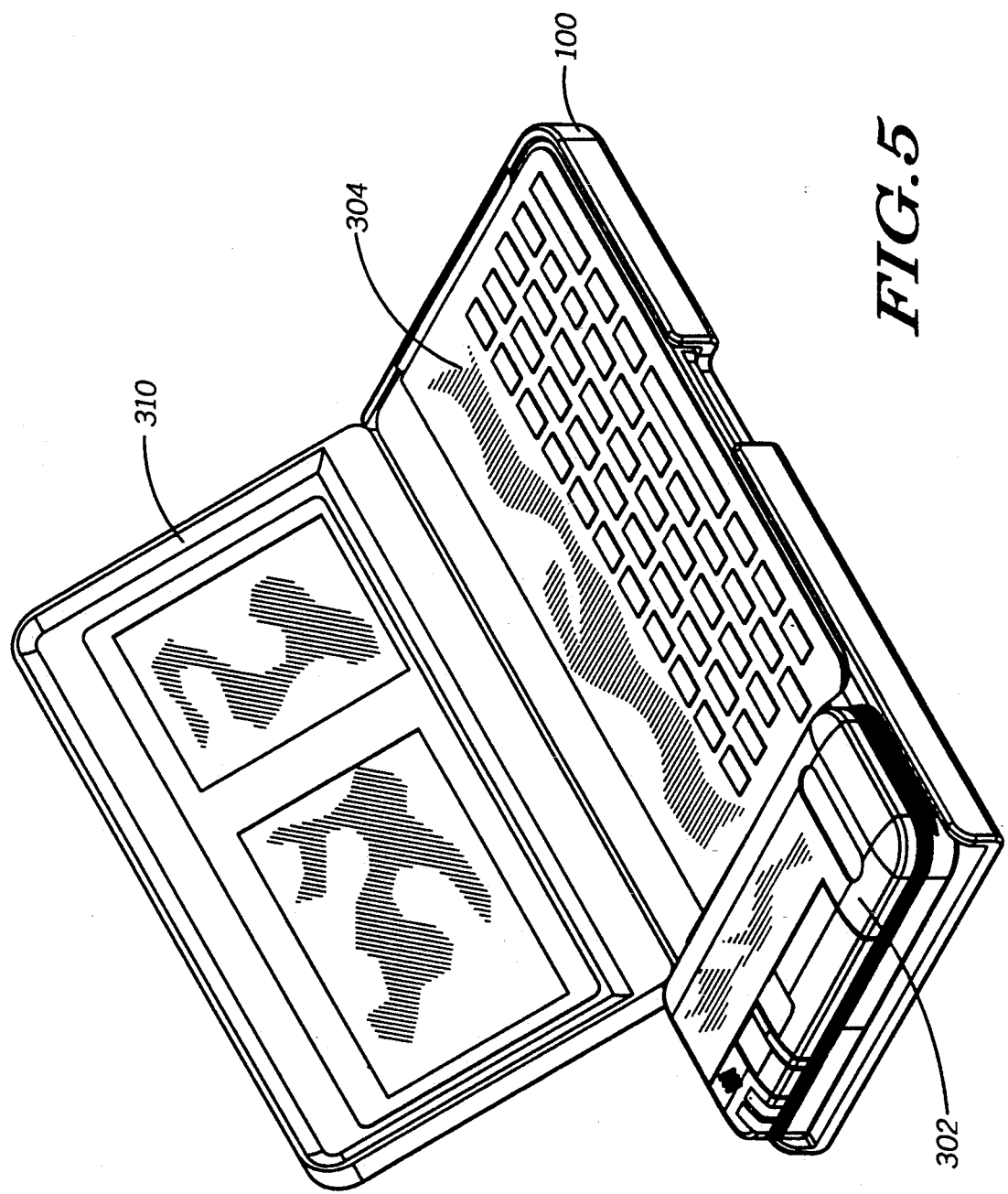
FIG. 5 is a top left front isometric view showing the selective call receiver and the electronic organizer both fully installed in the consolidation cradle in accordance with the preferred embodiment of the present invention.

With reference to FIG. 5, a top left front isometric view shows the selective call receiver 302 and the electronic organizer 304 both fully installed in the consolidation cradle 100 in accordance with the preferred embodiment of the present invention. To remove the selective call receiver 302 and the electronic organizer 304 from the consolidation cradle 100, the snap 119

Figure 6:
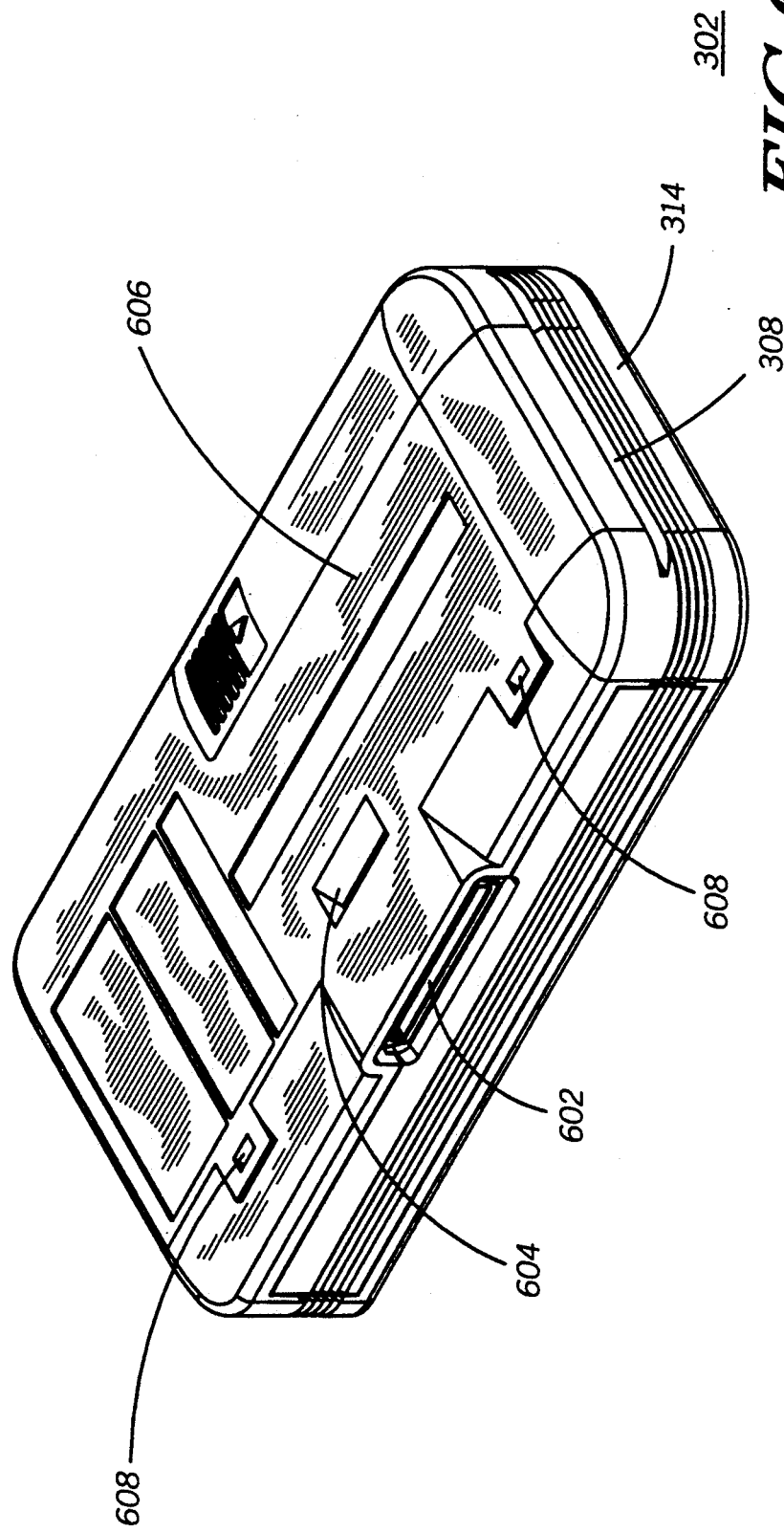
FIG. 6 is a bottom right rear isometric view of the selective call receiver in accordance with the preferred embodiment of the present invention.

(FIG. 1) must be unlocked from the latch aperture 604 (FIG. 6). To do this, the user applies a moderate upward force to the underside of the spring-loaded snap lever 118 (FIG. 1) through the access aperture 132 (FIG. 1) to rotate the snap 119 (FIG. 3) away from the latch aperture 604. Next, the user slides the selective call receiver 302 to the left to uncouple and remove the selective call receiver 302 from the consolidation cradle 100. This action restores the double sided connector 108 (FIG. 4) and the movable bulkhead 110 (FIG. 4) to the position somewhat to the left of the bridge 130 (FIG. 4), thus providing clearance for the electronic organizer 304 also to be removed from the consolidation cradle 100.

With reference to FIG. 6, a bottom right rear isometric view shows the selective call receiver 302 in accordance with the preferred embodiment of the present invention. In this view the data port 602 and the latch aperture 604 in the bottom housing wall 606 are clearly shown, as well as the apertures 608 for engaging with the small snaps 127. Also shown is one of the grooves 308 formed in the rear housing wall 314 for mating with one of the rails 116 (FIG. 3) of the consolidation cradle 100 (FIG. 3).

Materials used in the construction of the preferred embodiment of the present invention are preferably as follows:

| | |
|---|---|
| cradle floor, walls, and bridge | ABS plastic |
| movable bulkhead 110 | nylon |
| spring-loaded snap lever 118 | nylon |
| elastomer for snap lever | Poron |
| cover 124 | ABS plastic |
| bulkhead bracket 112 | sheet metal |
| end bracket 114 | sheet metal |
| bulkhead spring 202 | stainless steel wire |
| body of connector 108 | Zydar G540 (LCP) |
| contact pins 109 | phosphor bronze, w/ nickel undercoat & gold plating. |

One of ordinary skill in the art will recognize that other similar materials may be substituted to construct the apparatus in accordance with the present invention.

Figure 7:
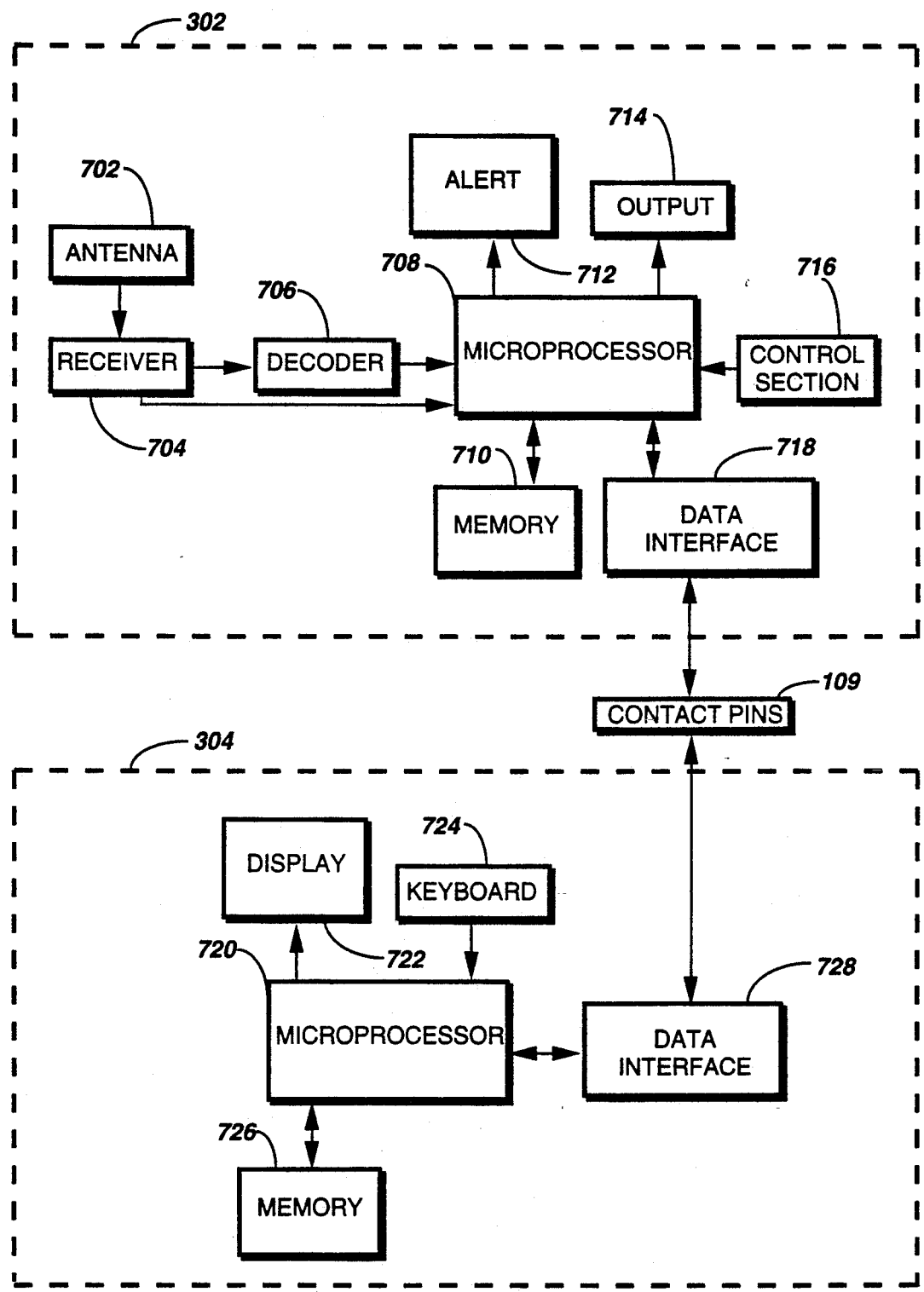
FIG. 7 is an electrical block diagram of a selective call receiver and an electronic organizer coupled together in accordance with the preferred embodiment of the present invention.

With reference to FIG. 7, an electrical block diagram of the selective call receiver 302 and the electronic organizer 304 coupled together in accordance with the preferred embodiment of the present invention comprises an antenna 702 for intercepting RF signals. The antenna 702 is coupled to a receiver 704 for receiving and demodulating the RF signals intercepted. A decoder 706 is coupled to the receiver 704 for decoding demodulated information. A microprocessor 708 receives the decoded information from the decoder 706. The microprocessor 708 is also coupled to the receiver 704 and processes the demodulated information to recover messages. The microprocessor 708 is coupled to a memory 710 for storing the messages recovered, and the microprocessor 708 controls the storing and recalling of the messages. An alert generator 712 is coupled to the microprocessor 708 for providing an audible or tactile alert to a user when the microprocessor 708 has a message ready for presentation.

An output device 714 comprises a visual display or a speaker or both, the output device 714 also being controlled by the microprocessor 708. A control section 716 comprises user accessible controls for allowing the user to command the microprocessor 708 to perform the selective call receiver operations well known to those skilled in the art and typically includes control switches such as an on/off control button, a function control, etc.

The microprocessor 708 is coupled to a data interface 718 for communicating with the data interface 718. The data interface 718 electrically couples with a data interface 728 of the electronic organizer 304 by means of the contact pins 109, in accordance with the present invention. The data interface 728 is coupled to a microprocessor 720, which communicates with the data interface 728. Also coupled to the microprocessor 720 are a display 722, a keyboard 724, and a memory 726 comprising the user interfaces and data storage portions of the electronic organizer 304.

With reference to FIGS. 8, 9, and 10, a longitudinal cross-section along the line 8—8 of FIG. 1 of the consolidation cradle 100 is depicted first in an empty condition, then with the electronic organizer 304 installed therein, and then with both the electronic organizer 304 and the selective call receiver 302 (without internal details) installed therein in accordance with the preferred embodiment of the present invention.

Thus, the present invention provides a better way of mechanically and electrically coupling two portable electronic devices. Also, the present invention is particularly advantageous if one portable electronic device comprises a geometry that restricts it from sliding horizontally toward the other portable electronic device. The present invention mechanically couples the two portable electronic devices into an easily maneuvered physical whole having sufficient mechanical strength to endure all conditions of normal portable use without inadvertent uncoupling. Even so, when a user desires to couple or uncouple the two portable electronic devices, the present invention provides a system that can be quickly and easily assembled and disassembled. The present invention is particularly advantageous for coupling two devices that provide complimentary functions, e.g., a selective call receiver and an electronic personal organizer.

What is claimed is:

1. An apparatus for electrically and mechanically coupling first and second electronic devices, the apparatus comprising:
    connector means for coupling the first and second electronic devices;
    cradle means having a substantially horizontal floor and substantially vertical walls for fixing the position of the first electronic device,
    wherein the cradle means comprises a first end formed to provide an opening that allows entry and movement of the second electronic device towards the connector means while substantially aligning the second electronic device with the connector means, and
    wherein the cradle means further comprises movable bulkhead means mechanically coupled to the connector means for substantially aligning the connector means with the first and second electronic devices, while allowing the connector means and the second electronic device when coupled to the connector means to move toward the first electronic device for coupling the second electronic device to the first electronic device through the connector means.

2. The apparatus in accordance with claim 1, further comprising spring means coupled between the cradle means and the movable bulkhead means for holding the movable bulkhead means away from the first electronic device until the second electronic device is installed in the cradle means.

3. The apparatus in accordance with claim 1, wherein the cradle means further comprises bridge means mechanically coupled between front and rear vertical walls of the cradle means and spanning over the movable bulkhead means substantially parallel to the movable bulkhead means.

4. The apparatus in accordance with claim 1,
wherein the movable bulkhead means has an alignment aperture for aligning the connector means, and
wherein the alignment aperture is larger than the connector means to absorb mechanical tolerance build-ups to minimize stress on the connector means.

5. The apparatus in accordance with claim 1, wherein the cradle means is constructed substantially of an injection molded ABS plastic.

6. The apparatus in accordance with claim 1,
wherein protruding rails substantially parallel to the floor of the cradle are formed in the front and rear vertical walls near the first end, and
wherein the second electronic device comprises corresponding front and rear walls having grooves formed lengthwise therein for mating with the protruding rails to vertically restrain the second electronic device while allowing horizontal movement to and from the first electronic device.

7. The apparatus in accordance with claim 1, further comprising a latch mechanism for securing the first electronic device to the cradle means after the first electronic device is placed into the cradle means.

8. The apparatus in accordance with claim 7, wherein the latch mechanism comprises a sheet metal bracket coupled near the top of a vertical end wall at a second end of the cradle for latching the cradle means to the first electronic device when the first electronic device is installed in the cradle means and placed against the vertical end wall.

9. The apparatus in accordance with claim 1, further comprising a latch mechanism for securing the second electronic device to the cradle means and to the first electronic device after the second electronic device is installed in the cradle means.

10. The apparatus in accordance with claim 9,
wherein the second electronic device comprises a surface having an aperture therein, and
wherein the latch mechanism comprises a spring-loaded snap lever mounted within the cradle means for engaging with the aperture when the second electronic device is installed in the cradle means.

11. An apparatus for electrically and mechanically coupling a selective call receiver and an electronic organizer, the apparatus comprising:
a connector for coupling the selective call receiver and the electronic organizer;
a cradle having a substantially horizontal floor and substantially vertical walls for fixing the position of the electronic organizer,
wherein the cradle comprises a first end formed to provide an opening that allows entry and movement of the selective call receiver towards the connector while substantially aligning the selective call receiver with the connector, and
wherein the cradle further comprises a movable bulkhead mechanically coupled to the connector for substantially aligning the connector with the electronic organizer and the selective call receiver, while allowing the connector and the selective call receiver when coupled to the connector to move toward the electronic organizer for coupling the selective call receiver to the electronic organizer through the connector.

12. The apparatus in accordance with claim 11, further comprising a spring coupled between the cradle and the movable bulkhead for holding the movable bulkhead away from the electronic organizer until the selective call receiver is installed in the cradle.

13. The apparatus in accordance with claim 11, wherein the cradle further comprises a bridge mechanically coupled between front and rear vertical walls of the cradle and spanning over the movable bulkhead substantially parallel to the movable bulkhead.

14. The apparatus in accordance with claim 11,
wherein the movable bulkhead has an alignment aperture for aligning the connector, and
wherein the alignment aperture is larger than the connector to absorb mechanical tolerance build ups to minimize stress on the connector.

15. The apparatus in accordance with claim 11, wherein the cradle is constructed substantially of an injection molded ABS plastic.

16. The apparatus in accordance with claim 11,
wherein protruding rails substantially parallel to the floor of the cradle are formed in the front and rear vertical walls near the first end, and
wherein the selective call receiver comprises corresponding front and rear walls having grooves formed lengthwise therein for mating with the protruding rails to vertically restrain the selective call receiver while allowing horizontal movement to and from the electronic organizer.

17. The apparatus in accordance with claim 11, further comprising a latch mechanism for securing the electronic organizer to the cradle after the electronic organizer is placed into the cradle.

18. The apparatus in accordance with claim 17, wherein the latch mechanism comprises a sheet metal bracket coupled near the top of a vertical end wall at a second end of the cradle for latching the cradle to the electronic organizer when the electronic organizer is installed in the cradle and placed against the vertical end wall.

19. The apparatus in accordance with claim 11, further comprising a latch mechanism for securing the selective call receiver to the cradle and tot he electronic organizer after the selective call receiver is installed in the cradle.

20. The apparatus in accordance with claim 19,
wherein the selective call receiver comprises a surface having an aperture therein, and
wherein the latch mechanism comprises a spring-loaded snap lever mounted within the cradle for engaging with the aperture when the selective call receiver is installed in the cradle.

* * * * *